United States Patent
Matsuzawa et al.

(10) Patent No.: US 7,718,926 B2
(45) Date of Patent: May 18, 2010

(54) FILM DEPOSITION APPARATUS, FILM DEPOSITION METHOD, MONITORING PROGRAM FOR FILM DEPOSITION APPARATUS, AND RECORDING MEDIUM THEREOF

(75) Inventors: Yutaka Matsuzawa, Niigata (JP); Wataru Nishida, Niigata (JP); Hideaki Mito, Niigata (JP); Yoshinori Takamori, Niigata (JP)

(73) Assignee: Panasonic Corporation, Osaka (JP)

( * ) Notice: Subject to any disclaimer, the term of this patent is extended or adjusted under 35 U.S.C. 154(b) by 972 days.

(21) Appl. No.: 11/488,784

(22) Filed: Jul. 19, 2006

(65) Prior Publication Data
US 2007/0095799 A1  May 3, 2007

(30) Foreign Application Priority Data
Oct. 31, 2005  (JP) .............................. 2005-315526

(51) Int. Cl.
F27B 5/18 (2006.01)
(52) U.S. Cl. ...................... 219/411; 219/413; 219/494; 219/496; 118/725; 118/50.1
(58) Field of Classification Search ........................ None
See application file for complete search history.

(56) References Cited

U.S. PATENT DOCUMENTS

| 7,526,699 B2* | 4/2009 | Kaushal et al. .............. 714/733 |
| 2002/0183977 A1* | 12/2002 | Sui et al. ..................... 702/188 |
| 2008/0208385 A1* | 8/2008 | Sakamoto et al. ........... 700/121 |

FOREIGN PATENT DOCUMENTS

| JP | 2001-015504 | 1/2001 |
| JP | 2002-108408 | 4/2002 |
| JP | 2002-522912 | 7/2002 |
| JP | 2002-261039 | 9/2002 |
| WO | WO 01/50206 A1 | 7/2001 |

* cited by examiner

*Primary Examiner*—Joseph M Pelham
(74) *Attorney, Agent, or Firm*—Steptoe & Johnson LLP

(57) ABSTRACT

In order to detect a change in the temperature of a substrate (2) and a change of the distribution of oxygen radical concentration near a surface of the substrate (2), a lamp power in each zone of a heater (3) and a pressure in a reactor (1) are measured, the measured lamp power in each zone of the heater (3) and the measured pressure in the reactor (1) are inputted to the prediction equation of process model of a monitoring device (16) to predict the thickness profile of the substrate (2), and it is decided whether an abnormality occurs in thermal processing on the substrate (2) based on the predicted thickness profile.

12 Claims, 7 Drawing Sheets

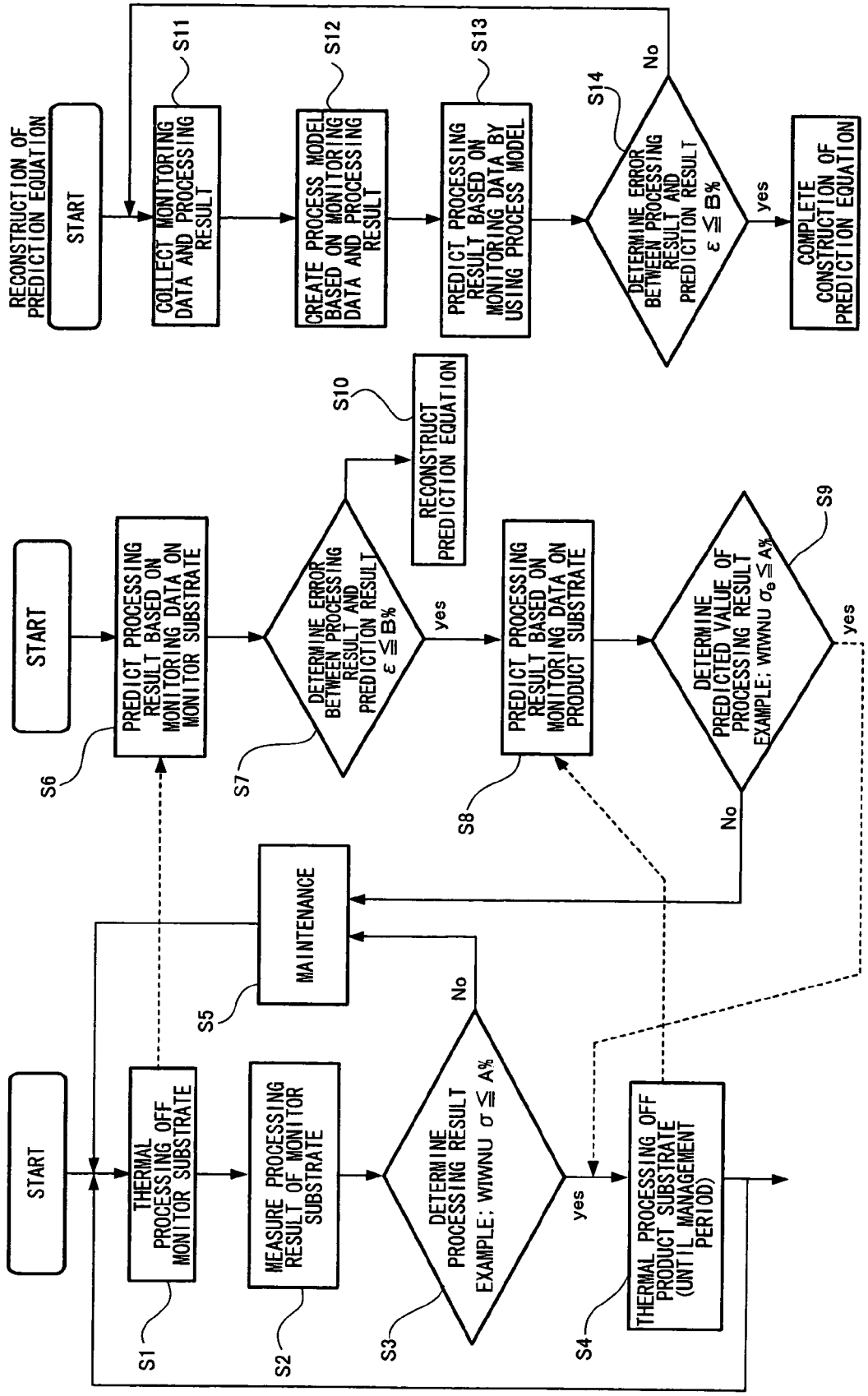

FILM DEPOSITION APPARATUS, FILM DEPOSITION METHOD, MONITORING PROGRAM FOR FILM DEPOSITION APPARATUS, AND RECORDING MEDIUM THEREOF

FIELD OF THE INVENTION

The present invention relates to a film deposition apparatus and a film deposition method employed in a sheet-fed rapid thermal processing apparatus (RTP apparatus) for a process of thermal processing in the manufacturing of semiconductors.

BACKGROUND OF THE INVENTION

In film deposition apparatuses and film deposition methods in which publicly known sheet-fed RTP apparatuses are used, the accuracy of measuring a substrate temperature in a high-temperature region may be affected by variations in measured temperature between temperature sensors and different positions of a temperature sensor relative to a specific substrate in a reactor (chamber). For example, in a publicly known film deposition apparatus and film deposition method described in National Publication of International Patent Application No. 2002-522912, temperature measurement values are accurately obtained in a high-temperature region by correcting variations in measured temperature between temperature sensors and different positions of a temperature sensor relative to a specific substrate during substrate processing.

The following will describe the publicly known film deposition apparatus and film deposition method described in National Publication of International Patent Application No. 2002-522912.

In the publicly known film deposition apparatus, a substrate transported into a reactor is held by a substrate supporting part and rotated at a desired rpm, process gas is introduced into the reactor, and the substrate is heated by a lamp in each zone of a heater disposed above the substrate, so that a film is formed on the substrate.

The publicly known film deposition apparatus includes a pyrometer (temperature sensors), a measurement device, a lamp power supply, a processor, a temperature recipe (temperature cycle/profile), and a temperature controller.

The pyrometer can measure a temperature in a high-temperature region of about 1000° C. and is placed under the reactor to measure temperatures on different positions in the radial direction of the underside of the substrate. The measurement device includes, for example, a polarization analyzer and measures the thickness of a coating (film thickness) of a substrate 2. The lamp power supply adjusts a voltage (lamp voltage) applied to the lamp in each zone of the heater. The processor calculates a temperature correction value based on the thickness having been measured by the measurement device and predetermined processing conditions. The temperature recipe sets a desired substrate temperature in advance and changes the set substrate temperature with time.

The temperature controller corrects temperature measurement values having been measured by the pyrometer on different positions in the radial direction of the underside of the substrate (underside temperatures on substrate positions) based on a temperature correction algorithm, corrects the output of the lamp power supply based on the corrected underside temperatures on the substrate positions, the temperature having been set by the temperature recipe, and the temperature correction value having been calculated by the processor, and the temperature controller controls the temperature of the substrate to "the set substrate temperature changing with time" which is inputted according to the temperature recipe, so that the thickness of a coating formed on each position on the substrate, that is, the thickness profile of the substrate is controlled. With the temperature correction algorithm, a fixed adjustment is made on the substrate underside temperatures having been obtained by the pyrometer on the substrate positions, and accurate temperature measurement values are obtained in the high-temperature region.

According to the configuration of the publicly known film deposition apparatus, the substrate transported into the reactor is held by the substrate supporting part and rotated at, for example, at 100 rpm, process gas is introduced with a fixed flow rate, the lamp voltage of a lamp in each zone of the heater disposed in a radial zone is separately set based on the substrate underside temperature or the like having been sampled and corrected from the pyrometer by the temperature controller, and the thickness of the coating formed on each position on the substrate, that is, the thickness profile of the substrate is controlled, so that a desired coating is formed on the substrate. Since temperatures are measured on different positions in the radial direction of the underside of the substrate, the pyrometer generates (measures) a mean temperature on different ring-shaped regions on the substrate. The ring-shaped regions correspond to the zones of the heater.

The publicly known film deposition apparatus and film deposition method cause the following problem:

The substrate underside temperature measured by the pyrometer on each substrate position is controlled to the set substrate temperature having been set according to the temperature recipe, so that the thickness profile of the substrate is controlled. Therefore, for example, when the substrate temperature changes on a point other than measurement points or the distribution of an oxygen radical concentration changes near the surface of the substrate, in other words, even when the state of the apparatus changes so as to vary the thickness profile, the temperature measurement value is normal and an abnormality is hard to detect in the thickness profile.

DISCLOSURE OF THE INVENTION

In order to solve the problem, an object of the present invention is to provide a film deposition apparatus and a film deposition method whereby an abnormality can be detected in real time in the event of a change in the thickness profile of a substrate.

In order to attain the object, according to a film deposition apparatus and a film deposition method of the present invention, the power consumption distribution of a heating lamp (the lamp power in each zone of a heater) and a pressure in a reactor are measured to detect a substrate temperature and a change of the distribution of an oxygen radical concentration near a surface of a substrate during the thermal processing of the substrate, the measured lamp power in each zone of the heater and the measured pressure in the reactor are inputted to the prediction equation of the process model of the thickness profile of the substrate to predict a thickness profile, and it is decided whether an abnormality occurs in the thickness profile based on the predicted thickness profile.

BRIEF DESCRIPTON OF THE DRAWINGS

FIGS. 2A and 2B show a processing flowchart of the film deposition apparatus;

FIG. 2C shows a flowchart for constructing a prediction equation;

DESCRIPTION OF THE EMBODIMENTS

According to a first gist of the present invention, by utilizing a certain property of the level of contribution of lamps in the zones of a heater to thermal processing in each reactor, thermal processing results (thickness profile) are predicted during thermal processing by using monitoring data mainly concerning a lamp power in each zone.

According to a second gist of the present invention, by utilizing a principle that an oxygen radical is generated according to an oxygen concentration and a temperature of gas supplied to a reactor and the oxygen radical disappears due to collision with gaseous molecules, a substrate temperature and the distribution of an oxygen radical concentration on a substrate surface are actively changed so as to match with a desired thermal processing result (thickness profile).

The following will describe embodiments of the present invention in accordance with the accompanying drawings.

Embodiment 1

Figure 1:
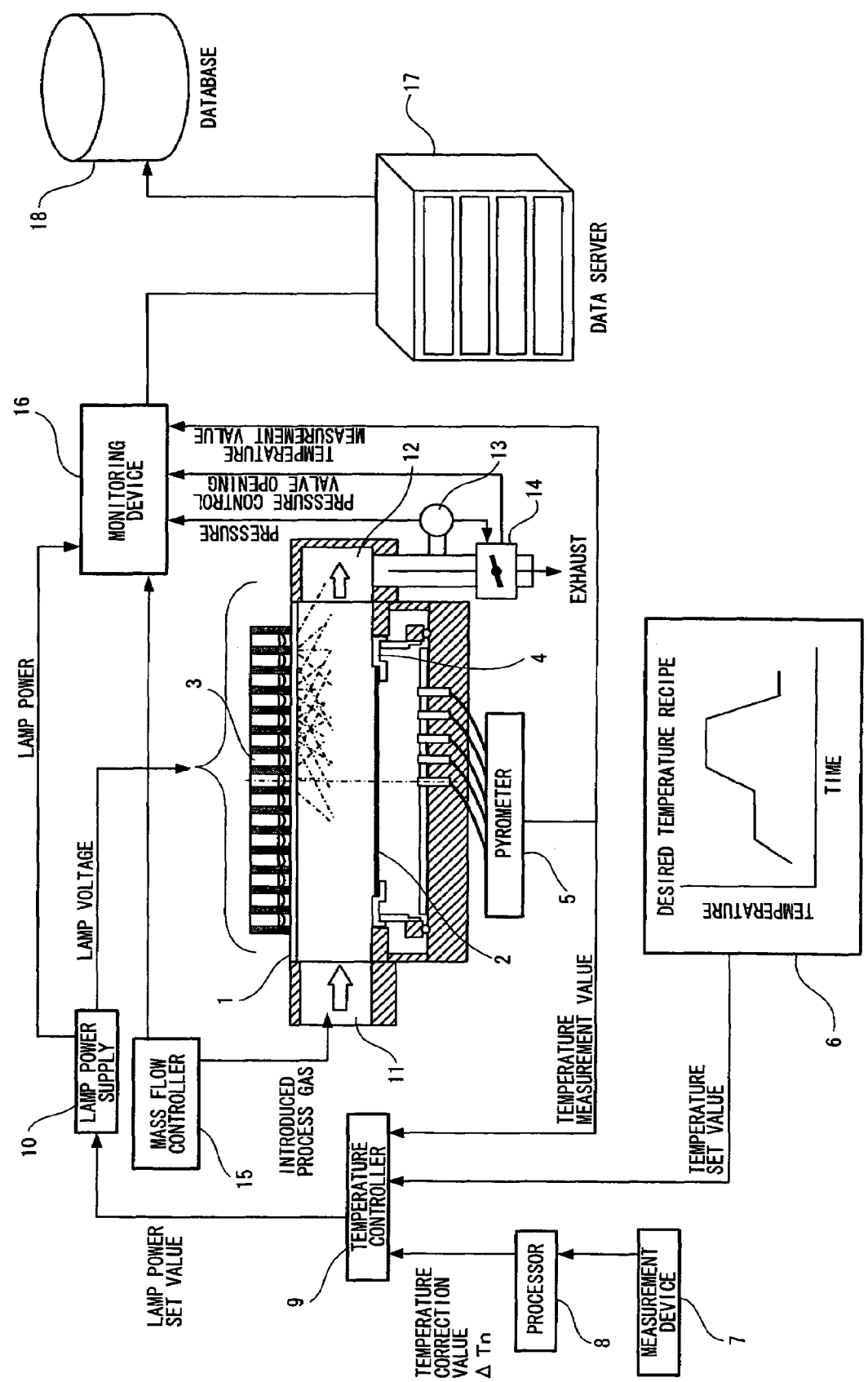
FIG. 1 is a structural diagram showing a main part of a film deposition apparatus according to Embodiment 1 of the present invention.

FIG. 1 is a structural diagram showing the main part of a film deposition apparatus according to Embodiment 1 of the present invention.

The film deposition apparatus according to Embodiment 1 of the present invention comprises a reactor (processing chamber) 1 to which process gas is introduced, a heater 3, a substrate supporting part 4, a pyrometer (thermometer) 5, a temperature recipe (temperature cycle/profile) 6, a measurement device 7, a processor 8, a temperature controller 9, a lamp power supply 10, a process gas supply port (inlet) 11, an outlet 12, a pressure gauge 13, a pressure control valve 14, a mass flow controller 15, a monitoring device 16, a data server 17, and a database 18.

The heater 3 is disposed above a substrate 2 having been transported into the reactor 1 and heats the substrate 2 with a lamp (e.g., halogen lamp) placed in each zone. The substrate supporting part 4 holds the substrate 2 having been transported into the reactor 1 and rotates at a desired rpm. The pyrometer (thermometer) 5 can measure a temperature in a high-temperature region of about 1000° C. and is placed under the reactor 1 to measure substrate temperatures on a plurality of positions in the radial direction of the substrate 2.

The temperature recipe 6 sets a desired substrate temperature in advance and changes the set substrate temperature with time.

The measurement device 7 includes, for example, a polarization analyzer and measures the thickness of a coating (film thickness) of the substrate 2. The processor 8 calculates a temperature correction value based on the thickness having been measured by the measurement device 7 and predetermined processing conditions. The lamp power supply 10 adjusts a voltage (lamp voltage) applied to the lamp in each zone of the heater 3.

The temperature controller 9 separately sets the lamp powers in the zones of the heater 3 based on substrate temperatures (underside temperatures of the substrate 2) having been measured on the plurality of measurement points in the radial direction of the substrate 2 by the pyrometer 5. And then, the temperature controller 9 outputs the lamp powers to the lamp power supply 10 to control the surface temperature of the substrate. A control method of the temperature controller 9 will be specifically described below.

First, the temperature controller 9 corrects, based on a temperature correction algorithm, the temperature measurement values having been measured by the pyrometer 5. With the temperature correction algorithm, a fixed adjustment is made on the temperature measurement values having been obtained from the pyrometer 5. Such an adjustment is necessary because there is generally a small disparity between a temperature obtained from the pyrometer 5 and an actual substrate temperature. Subsequently, while feeding back the corrected temperature measurement values, the temperature controller 9 determines the lamp output (power set value; power level) in each zone of the heater 3 such that the lamp output reaches the set substrate temperature having been inputted according to the temperature recipe 6, and then the temperature controller 9 adjusts the lamp voltage. In order to determine the power set value in each zone of the heater 3, the temperature controller 9 uses a matrix which describes the mathematical relationship between a desired change of power supplied to a lamp in a specific zone of the heater 3 and the corresponding temperature change. In this way, the temperature controller 9 automatically adjusts power set values transmitted to the lamps in different zones so as to correct any temperature deviation from the desired temperature recipe 6, through a process cycle provided in the temperature controller 9. And then, the temperature controller 9 outputs the lamp voltage to the lamp power supply 10.

The process gas supply port (inlet) 11 is disposed on a side of the reactor 1 to introduce process gas to a surface of the substrate 2. The outlet 12 is connected to the opposite side of the reactor 1 from the process gas supply port 11 to exhaust the process gas. The pressure gauge 13 is disposed at a certain point of the outlet 12 to measure a pressure in the reactor 1. The pressure control valve 14 is disposed at a certain point of the outlet 12 to adjust a pressure in the reactor 1.

The mass flow controller (including a regulator) 15 is a controller for adjusting the flow rate and composition concentration of process gas supplied from the process gas supply port 11. The flow rate and composition concentration of process gas including $N_2$ (nitrogen) gas, $O_2$ (oxygen) gas, and $H_2$ (hydrogen) gas are adjusted through the mass flow controller 15. The process gas is introduced from the process gas supply port 11 into the reactor 1, passes above the substrate 2, and then is exhausted from the outlet 12. The pressure control valve 14 controls a pressure in the reactor 1 such that the measurement value of the pressure gauge 13 is equal to the set pressure. At this moment, oxygen contained in process gas on the surface of the substrate 2 is radicalized by heating and forms an oxide film on the heated surface of the substrate 2.

The monitoring device 16 is connected to the pyrometer 5, the lamp power supply 10, the pressure gauge 13, the pressure control valve 14, the mass flow controller 15, and the data server 17. The monitoring device 16 obtains, as monitoring data from the communications port of the film deposition apparatus or the output terminal of an apparatus sensor, temperatures on the plurality of measurement points on the substrate 2 from the pyrometer 5, obtains a pressure in the reactor (chamber) 1 from the pressure gauge 13, obtains the valve opening of the pressure control valve 14 from the pressure control valve 14, obtains the flow rate of process gas including $N_2$ (nitrogen) or $O_2$ (oxygen) from the mass flow controller 15, and obtains (sample) the lamp power in each zone of the heater 3 from the lamp power supply 10. The monitoring data (sensor information) having been obtained by the monitoring device 16 is transmitted to the data server 17, arranged in the data server 17 in a file format enabling reference for each lot and each substrate, and stored in the database 18.

Referring to the flowcharts of FIGS. 2A and 2B, the following will discuss the flow of thermal processing performed in the film deposition apparatus of Embodiment 1.

It is assumed that the thermal processing starts after the first maintenance. Prior to thermal processing on a substrate as a product (hereinafter referred to as a product substrate), thermal processing is performed on a substrate for monitoring (hereinafter referred to as a monitor substrate) in order to monitor the state of a formed coating (step S1)

Thereafter, processing results on the monitor substrate, that is, thicknesses on different positions in the radial direction on the substrate (thickness profile) are measured and stored as data (step S2).

Subsequently, for example, in the case where the WIWNU (Within Wafer Non-Uniformity) of an oxide film growth rate is regulated to a management value A or lower by a standard deviation value σ, it is decided whether the value σ of the processing result (thickness profile) having been measured and accumulated in step S2 is smaller than or equal to the management value A (step S3).

When the processing result (thickness profile) of the monitor substrate is smaller than or equal to the management value A, actual thermal processing is repeatedly performed on the product substrate until a management period (maintenance period) managed by the monitor (step S4). The processing from step S1 is repeated from the management period and the above steps are repeated until the maintenance period.

When a poor state of the apparatus is found in step S3 and the processing result of the monitor exceeds the management value A, thermal processing is not performed on the product substrate and maintenance is performed instead (step S5), in which, for example, the inside of the reactor 1 is cleaned again and the pyrometer 5 is cleaned and adjusted again. And then, the process returns to step S1.

Since the monitoring device 16 is connected to the film deposition apparatus, the monitoring device 16 collects monitoring data on the monitor substrate 2 from the film deposition apparatus concurrently with "the processing on the monitor substrate" in step S1, and the monitoring device 16 predicts the processing result (thickness profile) of the monitor substrate 2 based on the monitoring data by using the prediction equation of a process model (will be specifically described later) (step S6).

And then, the deviation σ of the measured thickness profile of the monitor substrate 2 in step S2 and a deviation (predicted value) $\sigma_e$ of the predicted film profile of the monitor substrate 2 in step S6 are calculated, and it is decided whether the value of an error $\epsilon=|\sigma-\sigma_e|$ is smaller than or equal to a management value B (step S7). When the error ε exceeds the management value B in step S7, the process advances to step S10 in which the prediction equation of the thickness profile (processing result) is reconstructed, and advances to the flow of reconstructing the prediction equation (will be specifically described later). The processing result is not predicted or decided until the prediction equation is reconstructed.

When the error ε is smaller than or equal to the management value B in step S7, while the film deposition apparatus actually performs thermal processing on the product substrate 2 in step S4, the monitoring device 16 collects monitoring data for each product substrate 2, obtains a thickness profile (processing result) of each substrate 2 by using the prediction equation, and calculates the predicted value $\sigma_e$ (step S8).

And then, it is decided whether the predicted value $\sigma_e$ of the processing result is smaller than or equal to the management value A (step S9). When the predicted value $\sigma_e$ of the processing result is smaller than or equal to the management value A in step S9, the film deposition apparatus continues processing on the product substrate 2. When the predicted value $\sigma_e$ exceeds the management value A, the process advances to step S5, the processing on the product substrate 2 is stopped, and maintenance is performed on the film deposition apparatus.

As described above, prior to thermal processing on the product substrate 2, it is decided whether the prediction of the processing result (thickness profile) of the monitor substrate 2 is normal or not. When the prediction is normal, thermal processing is actually performed on the product substrate 2, the predicted value $\sigma_e$ of a thermal processing result is obtained for each product substrate 2 at this moment, and it is decided whether the actual processing result of the product substrate 2 is preferable.

Referring to the flowchart of FIG. 2C, the following will discuss the flow of constructing the prediction equation. The flow is started when it is decided in step S10 that the process advances to the flow of constructing the prediction equation or when the state in the reactor 1 is changed upon startup, overhaul, maintenance or the like of the apparatus.

Since the monitoring device 16 is connected to the film deposition apparatus (heat treatment equipment), monitoring data on the monitor substrate in film deposition is collected from the film deposition apparatus concurrently with "the processing on the monitor substrate" in step S1, and thermal processing results (data on the actually measured thickness profile of the monitor substrate) are collected by measuring the processing results of the monitor substrate in step S2. Two or more sets of both data are obtained (step S11).

Thereafter, the parameters (specifically described later) of the prediction equation of a process model are determined based on the monitoring data and the data on the actually measured thickness profile (step S12)

Subsequently, a thermal processing result of the monitor substrate 2 is predicted using the prediction equation including the determined parameters, that is, the constructed process model and the collected monitoring data, and the predicted value $\sigma_e$ is determined (step S13).

And then, it is decided whether the value of error $\epsilon=|\sigma-\sigma_e|$ is smaller than or equal to the management value B (step S14) between the deviation σ of the measured thickness profile of the monitor substrate 2 in step S2 and the deviation $\sigma_e$ of the processing result of the monitor substrate 2 in step S13 (step S14). When the error ε exceeds the management value B in step S14, the process returns to step S11 to reconstruct the prediction equation of the processing result. The processing result is not predicted or decided until the prediction equation is reconstructed. When the error is smaller than or equal to the management value B in step S14, the prediction equation of the processing result (thickness profile) is completed and the prediction equation of the process model is reflected in the processing flows of steps S6 and S8 of FIG. 2.

In this case, it is necessary in step S11 to collect at least sets of data as many as or more than unknown parameters of the process model. Further, in order to accurately predict the state of the apparatus, it is desirable to obtain data of a long term corresponding to one or more maintenance periods.

Through steps S6 to S14, a monitoring program is generated which is used in the film deposition apparatus for forming a film on the substrate 2. Thus a recording medium readable by a computer can be formed. When the thickness profile of the monitor substrate 2 is measured by the measurement device 7, the monitor substrate 2 is generally processed in the reactor 1 and then processed in the air.

Figure 3A:
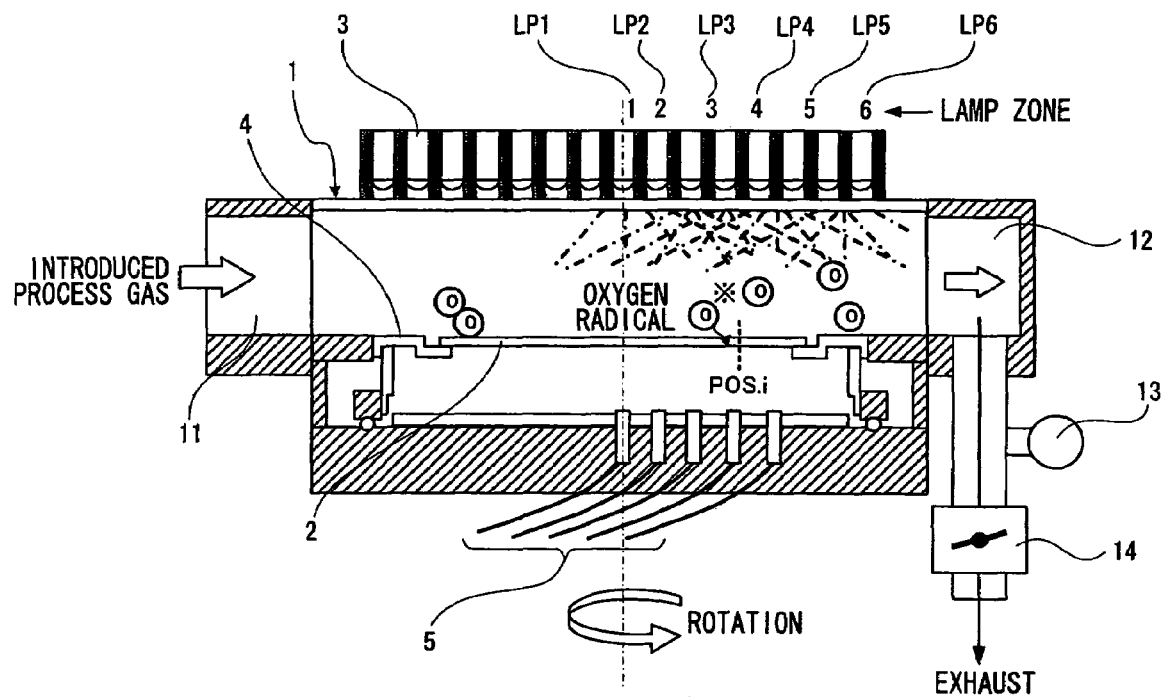
FIG. 3A is a diagram showing a principle of a process of thermal processing in the film deposition apparatus.

Referring to the principle diagram of FIG. 3 showing a process of thermal processing, the following will discuss an example of the process model used for constructing the prediction equation.

Particularly in the process of rapid thermal oxidation, the substrate 2 is heated by the lamps in the zones of the heater 3 disposed above the substrate 2 in the RTP apparatus while $O_2$ (oxygen) molecules are introduced into the reactor 1. At this moment, $O_2$ (oxygen) is activated by heating energy and transformed to O (oxygen) radical. The oxygen radical reacts with Si (silicon) of the substrate 2 and is transformed to $SiO_2$ (silicon dioxide), so that the oxidation of the substrate proceeds. The lamps disposed above the substrate are divided in zones almost concentrically on the substrate 2, so that the lamps spread to a certain extend and heat the substrate 2. The substrate 2 is heated while being rotated about the central axis of the concentrically arranged lamps. Thus a given position i on the substrate 2 is heated in a state in which mean values LP1 to LP6 of the lamp powers of the zones have a fixed rate of contribution. In other words, as a function for the mean values LP1 to LP6 of the lamp powers of the zones, an oxide film growth rate Di on the substrate position i can be approximated by equation 1.

$$Di = ai1 \times LP1 + ai2 \times LP2 + ai3 \times LP3 + ai4 \times LP4 + ai5 \times LP5 + ai6 \times LP6 + Bi \quad (1)$$

(ai1 to ai6 and Bi represent fixed constants)

Figure 3B:
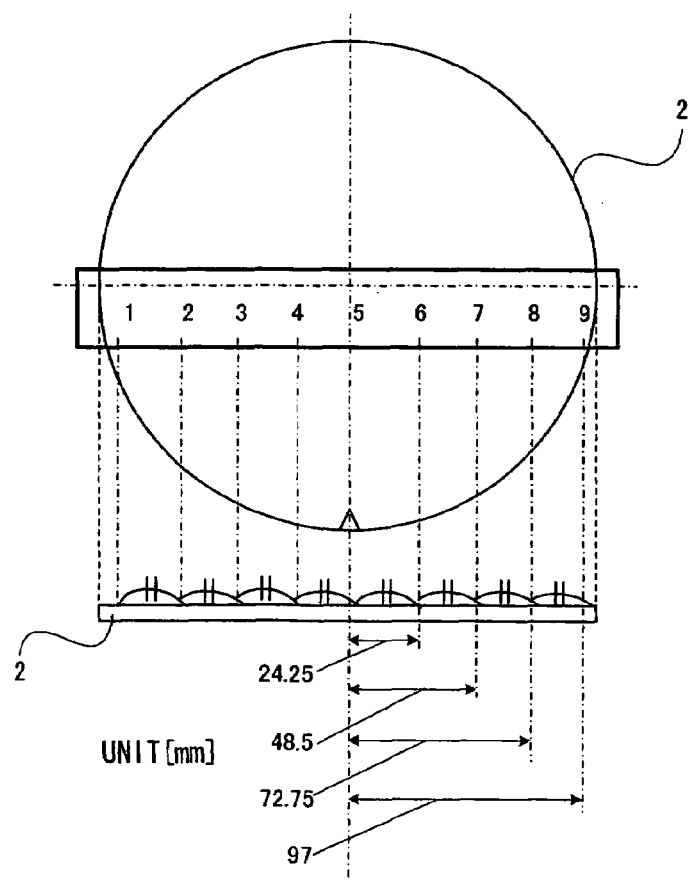
FIG. 3B is a diagram showing measurement points on a substrate.

The processing results of the substrate 2 are obtained by, for example, measuring the thickness of the oxide film on nine measurement points on the substrate 2 as shown in FIG. 3B. The nine measurement points are set by dividing the diameter of the substrate 2, except for a boundary on both ends.

Regarding resultant measurement data on the nine points, data at the same distance from the center of the substrate 2 in the radial direction can be combined into data on five points by determining mean values. Therefore equation 1 is extended, for the five positions in the radial direction, to equation 2 below:

$$\begin{pmatrix} D1 \\ \vdots \\ \boxed{Di} \\ \vdots \\ D5 \end{pmatrix} = \begin{pmatrix} a11 & a12 & a13 & a14 & a15 & a16 \\ & & \vdots & & & \\ \boxed{ai1 \ ai2 \ ai3 \ ai4 \ ai5 \ ai6} \\ & & \vdots & & & \\ a51 & a52 & a53 & a54 & a55 & a56 \end{pmatrix} \begin{pmatrix} LP1 \\ LP2 \\ \vdots \\ LP6 \end{pmatrix} + \begin{pmatrix} B1 \\ \vdots \\ \boxed{Bi} \\ \vdots \\ B5 \end{pmatrix} \quad (2)$$

For ai1 to ai6 and Bi (i=1, 2, 3, 4 and 5) in equation 2, 1) regarding the nine points where measurements are conducted by monitoring the monitor substrate 2, growth rates are calculated (Di) on the five points where the thicknesses of the oxide film have been averaged at the same distance from the center of a wafer, 2) the mean values LP1 to LP6 of the lamp powers of the zones are calculated in the step of forming the oxide film, and 3) the coefficients ai1 to ai6 and the constant Bi of equation 2 are calculated for each processing recipe by multiple regression analysis based on management data of a long term (one week or longer in the present embodiment), so that the parameters of equation 2 can be determined by multiple regression analysis.

As described above, according to Embodiment 1, the power consumption distribution of the lamps in the zones of the heater 3 is determined and the thickness profile is calculated by the prediction equation (equation 2) based on the result, so that a change of the thickness profile can be detected and an abnormality can be detected. Therefore, even when a temperature measurement value is normal but the apparatus has an abnormality causing a change of the thickness profile, the abnormality can be detected.

In Embodiment 1, the heater 3 is a halogen lamp and a change of the thickness profile is detected according to the power consumption of the heating lamp. Regardless of the type of heater, a change of the thickness profile can be detected by detecting energy consumption.

Embodiment 2

In Embodiment 2, a pressure in a reactor 1 is added to the prediction equation of the process model of Embodiment 1. The main parts of a film deposition apparatus and a film deposition method of Embodiment 2 are the same as Embodiment 1 and thus the explanation thereof is omitted.

Figure 4:
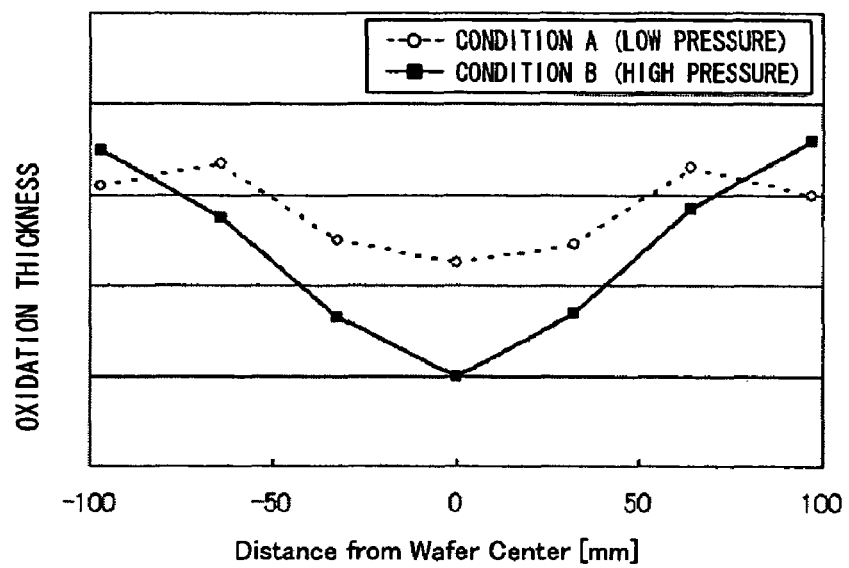
FIG. 4 shows in-plane profiles in an oxide film thickness in the film deposition apparatus according to Embodiment 2 of the present invention.
Figure 5:
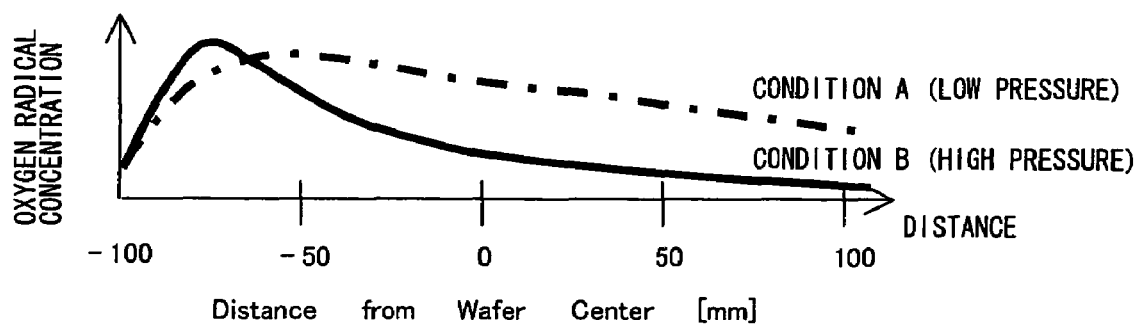
FIG. 5 is a diagram showing distributions of oxygen radical in the film deposition apparatus.

FIG. 4 shows an oxide film thickness profile of a monitor substrate 2 which is oxidized at a high pressure and a low pressure in the reactor 1 according to a film deposition recipe of an oxide film. It is found that the center of the substrate 2 is smaller in thickness at a high pressure than a low pressure in the reactor 1. The thickness profile is associated with the concentration of an oxygen radical which contributes to oxidation and is assumed to be distributed as shown in FIG. 5. The concentration distribution of the oxygen radical changes with a pressure in the reactor 1. Embodiment 2 utilizes this property and a pressure in the reactor 1 is added to a process model.

To be specific, a given position i on the substrate 2 is heated in a state in which mean values LP1 to LP6 of the lamp powers of zones have a fixed rate of contribution. The oxygen radical concentration on the position i is obtained by multiplying a mean value P of pressures in the reactor 1 by a fixed coefficient. Therefore, an oxide film growth rate Di on the substrate position i can be approximated by equation 3 below:

$$Di = ai1 \times LP1 + ai2 \times LP2 + ai3 \times LP3 + ai4 \times LP4 + ai5 \times LP5 + ai6 \times LP6 + ai7 \times P + Bi \quad (3)$$

(ai1 to ai7 and Bi represent fixed constants)

In Embodiment 2, the processing results of the substrate 2 are obtained by measuring the thickness of an oxide film on measurement points on the substrate 2 as shown in FIG. 3B. Regarding measurement data on the nine points, data at the same distance from the center of the substrate 2 in the radial direction can be combined into data on five points by determining mean values. Therefore equation 3 is extended, for the five positions in the radial direction, to equation 4 below:

$$\begin{pmatrix} D1 \\ \vdots \\ \boxed{Di} \\ \vdots \\ D5 \end{pmatrix} = \begin{pmatrix} a11 & a12 & a13 & a14 & a15 & a16 & a17 \\ & & & \vdots & & & \\ \boxed{ai1 & ai2 & ai3 & ai4 & ai5 & ai6 & ai7} \\ & & & \vdots & & & \\ a51 & a52 & a53 & a54 & a55 & a56 & a57 \end{pmatrix} \begin{pmatrix} \begin{pmatrix} LP1 \\ LP2 \\ \vdots \\ LP6 \\ P \end{pmatrix} \end{pmatrix} + \begin{pmatrix} B1 \\ \vdots \\ \boxed{Bi} \\ \vdots \\ B5 \end{pmatrix} \quad (4)$$

For ai1 to ai7 and Bi (i=1, 2, 3, 4 and 5) in equation 4, 1) regarding the nine points where measurements are conducted by monitoring the monitor substrate 2, growth rates are calculated (Di) on the five points where the thicknesses of the oxide film have been averaged at the same distance from the center of a wafer,
2) the mean values LP1 to LP6 of the lamp powers of the zones are calculated in the step of forming the oxide film and a mean value P of pressures in the reactor 1 is calculated, and
3) the coefficients ai1 to ai7 and the constant Bi of equation 4 are calculated for each processing recipe by multiple regression analysis based on management data of a long term (one week or longer in the present embodiment), so that the parameters of equation 4 can be determined by multiple regression analysis.

Figure 6A:
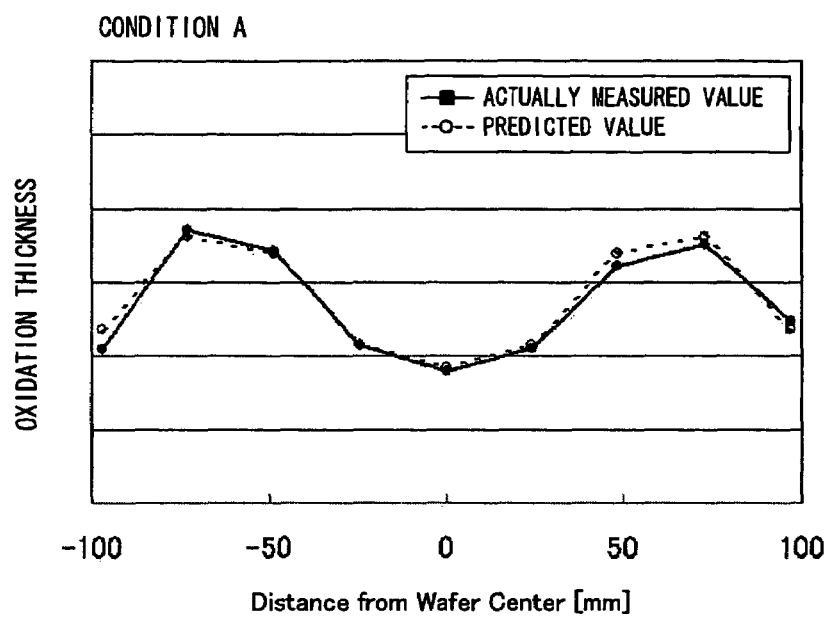
FIGS. 6A and 6B are diagrams each showing verification results of a film deposition profile according to a prediction equation of the film deposition apparatus.
Figure 6B:
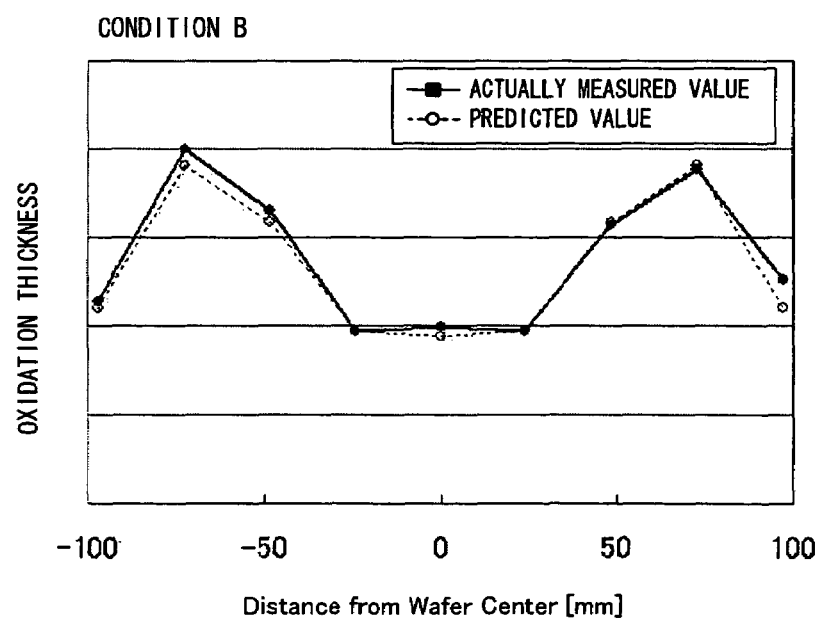
Figure 7A:
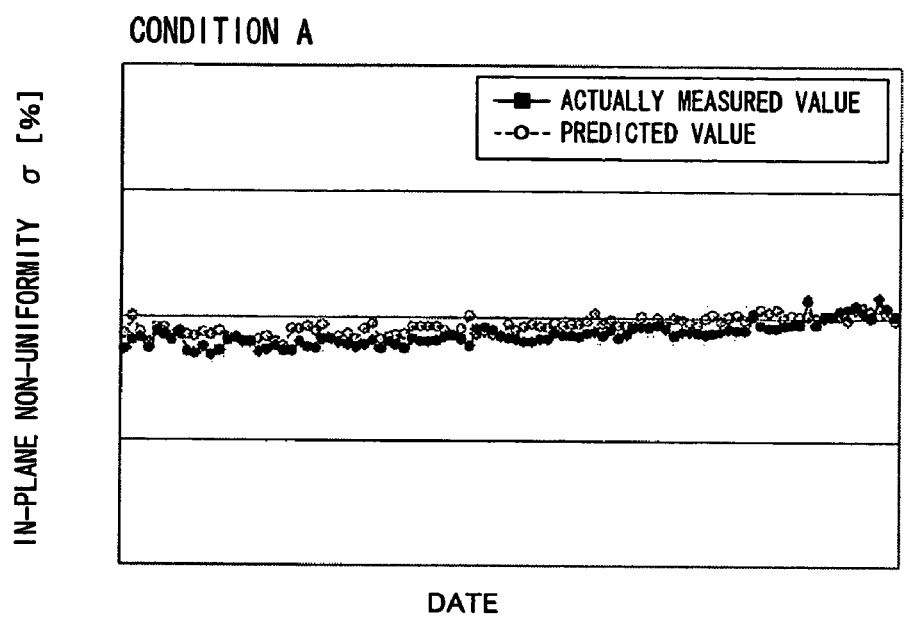
FIGS. 7A and 7B are diagrams each showing a long-term trend of predicted results and actually measured values of the film deposition apparatus.
Figure 7B:
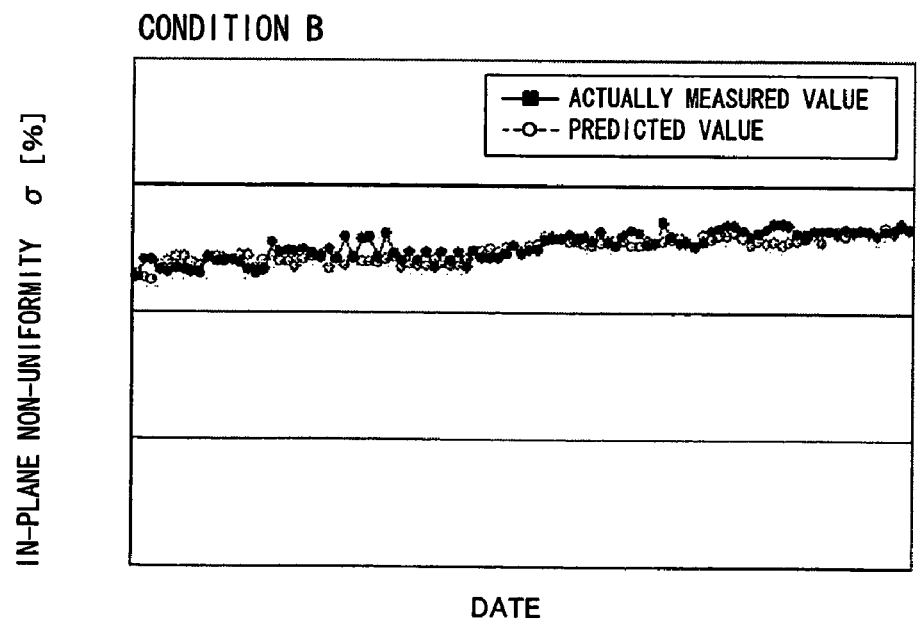

FIG. 6 shows verification results of the thickness profile according to the prediction equation. FIG. 7 shows a long-term trend of predicted results and actually measured values. FIG. 6 shows that the characteristics of the thickness profile are highly approximated and FIG. 7 shows that the predicted values and actual values of within wafer non-uniformity data on film deposition match with each other over a long period of time.

As described above, according to Embodiment 2, in order to detect a change in substrate temperature or a change in gas concentration near a surface of the substrate, the power consumption (power) distribution of the lamps of a heater 3 and a pressure in the reactor (chamber) 1 are measured and the thickness profile is calculated by the prediction equation (equation 4) based on the result, so that a change of the thickness profile can be detected. Therefore, even when a temperature measurement value is normal but the apparatus has an abnormality causing a change of the thickness profile, the abnormality can be detected.

In Embodiment 2, the pressure in the reactor 1 is used. Since a gist of the present invention is to change the distribution of the oxygen radical on the substrate 2, the flow rate of process gas introduced into the reactor 1, the oxygen concentration in the process gas, or a gas composition may be controlled by a mass flow controller 15 in addition to lamp powers controlled in the zones of the heater 3 by a lamp power supply 10 and a pressure controlled in the reactor 1 by a pressure control valve 14.

For approximation to a desired thickness profile, the parameters may be controlled and changed.

Embodiment 3

Figure 8:
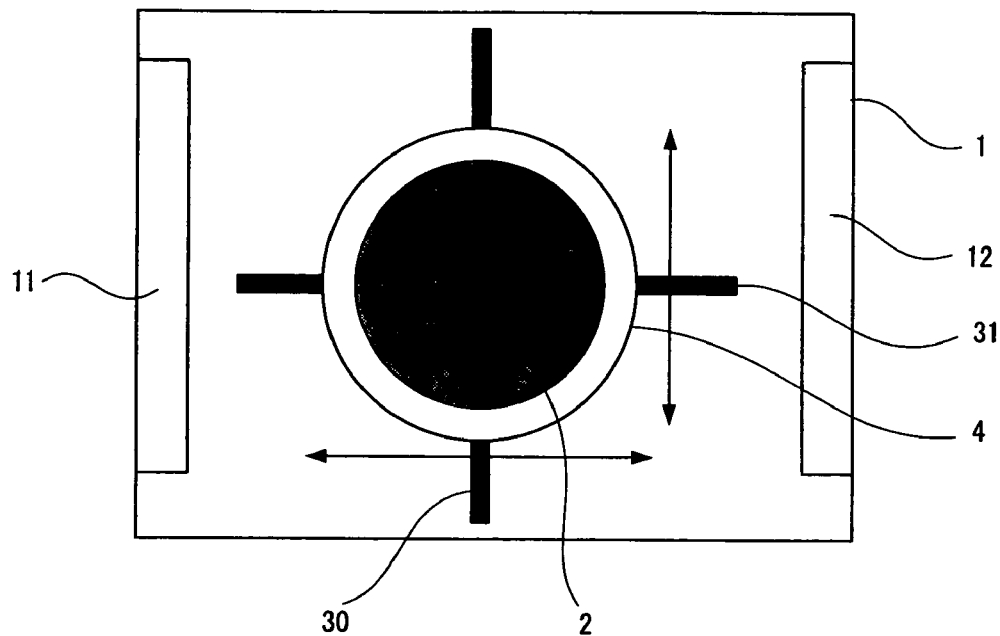
FIG. 8 is a structural diagram showing a substrate holding part of a film deposition apparatus according to Embodiment 3 of the present invention.

In Embodiment 3, as shown in FIG. 8, a substrate supporting part 4 supports a substrate 2 and rotates at a fixed rpm of about 100 rpm during heating. Further, the substrate supporting part 4 can move along the plane of the substrate 2 and can be driven by an X-direction drive shaft 30 and a Y-direction drive shaft 31. In FIG. 8, the same configurations as Embodiment 1 of FIG. 1 are indicated by the same reference numerals.

With this configuration, during the thermal processing of the substrate 2 which is transported into a reactor 1 and held by the substrate supporting part 4, the substrate 2 is moved to a desired position in the reactor 1 by the driving of the X-direction drive shaft 30 and the Y-direction drive shaft 31 in a state in which the substrate supporting part 4 is rotated or stopped.

This operation changes the distribution of an oxygen radical generated by process gas on a surface of the substrate 2, and changes the thickness profile.

By incorporating the position of the substrate 2 into the prediction equation (process model) having been obtained in Embodiment 1 or Embodiment 2, the thickness profile can be actively changed.

As described above, according to Embodiment 3, in order to vary a change in the temperature of the substrate 2 and a change of gas concentration distribution near the surface of the substrate 2 (in order to control the concentration of an oxygen radical near the surface of the substrate), the position of the substrate supporting part 4 is moved or a rotating surface for rotating the substrate 2 is made eccentric, so that the thickness profile can be actively changed. Therefore, even when a predicted value is different from a desired thickness profile, the predicated value can be matched with the desired thickness profile.

Embodiment 4

According to Embodiment 4 of the present invention, a heater and a process gas supply port are changed in a film deposition apparatus.

Figure 9:
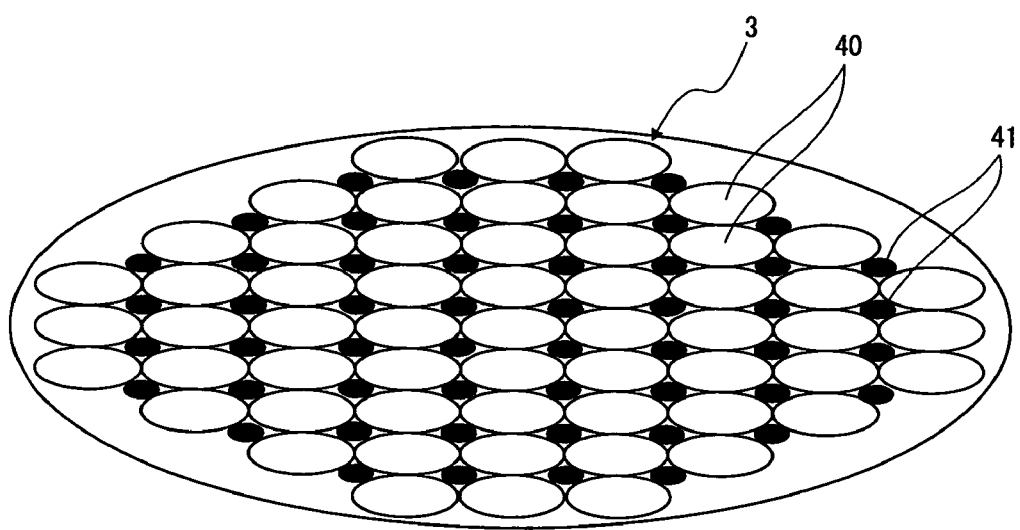
FIG. 9 is a structural diagram showing a heater and process gas supply ports in a film deposition apparatus according to Embodiment 4 of the present invention.

In FIG. 9, reference numeral 40 denotes lamps which are placed in a plurality of radial zones on a reactor 1. The lamps make up a heater 3. Process gas supply ports 41 for introducing process gas to a surface of a substrate 2 are disposed between the lamps 40 of the heater, and thus the process gas supply ports 41 are placed above the top surface of the substrate 2.

The operations will be discussed below.

During thermal processing, process gas is supplied from the process gas supply ports 41 placed above the top surface of the substrate 2 and exhausted from an outlet 12 on a side of the reactor 1. In the meantime, in a state in which the substrate supporting part 4 is rotated or stopped, an amount of process gas introduced from the supply ports 41 is changed to form a radical distribution of desired process gas. Further, the gas composition (gas concentration or composition) may be changed.

This operation changes the radical distribution of process gas on the surface of the substrate 2 and changes the thickness profile.

By incorporating the amount of process gas introduced from the process gas supply ports 41 into the prediction equation (process model) having been obtained in Embodiment 1 or Embodiment 2, the thickness profile can be actively changed.

As described above, according to Embodiment 4, in order to vary a change in the temperature of the substrate and a change of gas concentration distribution near the surface of the substrate (in order to control the concentration of an oxygen radical near the surface of the substrate), the process gas supply ports 41 are disposed between the lamps 40 of the heater and the flow rate (amount) of process gas introduced from the process gas supply ports 41 is changed or the gas composition of process gas introduced from the process gas supply ports 41 is changed, so that the thickness profile can be actively changed. Therefore, even when a predicted value is different from a desired thickness profile, the predicated value can be matched with the desired thickness profile.

Oxygen is described as process gas in Embodiments 1 to 4. The embodiments can be similarly implemented in a steam oxidation process of adding hydrogen to oxygen and a process of adding diluent gas such as nitrogen.

According to the film deposition apparatus and film deposition method of the present invention, the distribution of power consumption of the lamps in the zones of the heater is measured and a thickness profile is calculated based on the result, and thus the present invention is useful as a film deposition apparatus and a film deposition method in a film deposition process of semiconductor production.

What is claimed is:

1. A film deposition apparatus comprising:
   a reactor into which a substrate is transported and process gas is introduced,
   a substrate supporting part for holding the substrate and rotating it at a desired rpm,
   a heater disposed above the substrate and divided into a plurality of zones, each zone of the heater including a lamp, for heating the substrate and forming a film on the substrate,
   a thermometer for measuring substrate temperatures on a plurality of measurement points in a radial direction of the substrate,
   a lamp power supply for adjusting a lamp power outputted to the lamp in each zone of the heater,
   a temperature controller for separately setting a lamp power in each zone of the heater based on the substrate temperature which is measured by the thermometer, and for outputting the lamp power to the lamp power supply to control a surface temperature of the substrate,
   a pressure gauge for measuring a pressure in the reactor, and
   a monitoring device which has a process model of a thickness profile of the substrate, for inputting to a prediction equation of the process model, the lamp power in each zone of the heater from the lamp power supply or the lamp power and the pressure measured in the reactor by the pressure gauge during thermal processing of the substrate, for predicting the thickness profile, and for deciding whether an abnormality occurs in the thermal processing of the substrate based on the predicted thickness profile, the process model including functions of the lamp power in each zone of the heater or the lamp power and the pressure in the reactor.

2. The film deposition apparatus according to claim 1, wherein when a monitor substrate is heated prior to thermal processing on a product substrate, the monitoring device
   inputs, to the prediction equation of the process model, a lamp power in each zone of the heater from the lamp power supply for the monitor substrate or the lamp power and a pressure measured in the reactor by the pressure gauge to predict a thickness profile,
   decides whether an error between the predicted thickness profile of the monitor substrate and the actually measured thickness profile of the monitor substrate is smaller than or equal to a predetermined value, and
   uses the process model to predict a thickness profile of the product substrate when the error is smaller than or equal to the predetermined value, and reconstructs the prediction equation of the process model when the error exceeds the predetermined value.

3. The film deposition apparatus according to claim 2, wherein upon reconstructing the prediction equation of the process model, the monitoring device
   collects monitoring data including the lamp power in each zone of the heater for the monitor substrate or the lamp power and the pressure in the reactor concurrently with the thermal processing on the monitor substrate, and collects the thickness profile data of the monitor substrate concurrently with a measurement of the thickness profile,
   constructs a process model from sets of both data when the number of obtained sets of data is larger than or equal to the number of unknown parameters of the process model,
   predicts a thickness profile of the monitor substrate from the monitoring data by using the constructed process model,
   decides whether an error between the predicted thickness profile of the monitor substrate and the collected thickness profile of the monitor substrate is smaller than or equal to a management value, and
   decides that the prediction equation of the process model is completed when the error is smaller than or equal to the management value, and collects the monitoring data again to reconstruct the process model when the error exceeds the management value.

4. The film deposition apparatus according to claim 1, wherein
   the substrate supporting part is configured to rotate the substrate at the desired rpm and change a relative position of the substrate, and
   an oxygen radical concentration near a surface of the substrate is controlled by causing the substrate supporting part to change the relative position of the substrate in the reactor or making eccentric a substrate rotating surface of the substrate supporting part relative to the substrate surface kept in an almost horizontal position.

5. The film deposition apparatus according to claim 1, further comprising a plurality of process gas supply ports for introducing process gas into the reactor, the process gas supply ports being disposed between the lamps in the zones of the heater placed above the substrate, wherein an oxygen radical concentration near a surface of the substrate is controlled by changing a flow rate or a gas composition of the process gas introduced from the plurality of process gas supply ports to the substrate surface kept in an almost horizontal position.

6. The film deposition apparatus according to claim 1, further comprising a mass flow controller for controlling a flow rate, a concentration, or a composition of the process gas introduced into the reactor, and a pressure control valve for controlling the pressure in the reactor, wherein
   the lamp power in each zone of the heater is controlled by the lamp power supply, or a flow rate, a concentration, or a composition of process gas introduced into the reactor is controlled by the mass flow controller, or the pressure in the reactor is controlled by the pressure control valve, whereby an oxygen radical concentration near a surface of the substrate is controlled.

7. A film deposition method comprising:
   transporting a substrate into a reactor and holding the substrate with a substrate supporting part which can rotate the substrate at a desired rpm,
   introducing process gas into the reactor,
   heating the substrate with a heater disposed above the substrate, wherein the heater is divided into a plurality of zones, each zone of the heater including a lamp, to form a film on the substrate,
   applying a process model of a thickness profile of the substrate, the process model including functions of a lamp power in each zone of the heater or a lamp power and a pressure in the reactor, determining a lamp power in each zone of the heater and a pressure in the reactor during thermal processing of the substrate, predicting the thickness profile by inputting the lamp power in each zone of the heater or the determined lamp power and pressure in the reactor to a prediction equation of the process model, and deciding whether an abnormality occurs in the thermal processing of the substrate based on the predicted thickness profile.

8. The film deposition method according to claim 7, wherein when a monitor substrate is heated prior to thermal processing on a product substrate, the film deposition method comprises:

determining a lamp power in each zone of the heater for the monitor substrate and a pressure in the reactor, predicting the thickness profile by inputting the lamp power in each zone of the heater or the lamp power and pressure in the reactor to the prediction equation of the process model, deciding whether an error between the predicted thickness profile of the monitor substrate and an actually measured thickness profile of the monitor substrate is smaller than or equal to a predetermined value, and using the process model to predict a thickness profile of the product substrate when the error is smaller than or equal to the predetermined value, and reconstructing the prediction equation of the process model when the error exceeds the predetermined value.

9. The film deposition method according to claim 8, wherein when the prediction equation of the process model is reconstructed, the film deposition method comprises:

collecting monitoring data on the lamp power in each zone of the heater for the monitor substrate or on the lamp power and pressure in the reactor concurrently with the thermal processing of the monitor substrate, and collecting the thickness profile data of the monitor substrate concurrently with a measurement of the thickness profile, constructing a process model from sets of both data when the sets of obtained data is larger, in number, than or equal to unknown parameters of the process model, predicting a thickness profile of the monitor substrate from the monitoring data by using the constructed process model, deciding whether an error between the predicted thickness profile of the monitor substrate and the collected thickness profile of the monitor substrate is smaller than or equal to a management value, deciding that the prediction equation of the process model is completed when the error is smaller than or equal to the management value, and collecting again the monitoring data to reconstruct the process model when the error exceeds the management value.

10. The film deposition method according to claim 7, wherein an oxygen radical concentration near a surface of the substrate is controlled by causing the substrate supporting part to change a relative position of the substrate in the reactor or making eccentric a substrate rotating surface of the substrate supporting part relative to the substrate surface kept in an almost horizontal position.

11. The film deposition method according to claim 7, wherein the process gas is divided and introduced to a surface of the substrate kept in an almost horizontal position from thereabove, and an oxygen radical concentration near the surface of the substrate is controlled by changing a flow rate or a gas composition of the introduced process gas.

12. The film deposition method according to claim 7, wherein an oxygen radical concentration near a surface of the substrate is controlled by controlling the lamp power in each zone of the heater, controlling a flow rate, a concentration, or a composition of the process gas introduced into the reactor, or controlling the pressure in the reactor.

* * * * *